United States Patent
Yoo et al.

(10) Patent No.: US 9,748,179 B2
(45) Date of Patent: Aug. 29, 2017

(54) PACKAGE AND METHOD OF MANUFACTURING THE SAME

(71) Applicant: SAMSUNG ELECTRO-MECHANICS CO., LTD., Suwon-si (KR)

(72) Inventors: Do Jae Yoo, Suwon-si (KR); Kyu Hwan Oh, Suwon-si (KR); Jong In Ryu, Suwon-si (KR); Jae Hyun Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/810,947

(22) Filed: Jul. 28, 2015

(65) Prior Publication Data

US 2016/0035678 A1 Feb. 4, 2016

(30) Foreign Application Priority Data

Jul. 30, 2014 (KR) ........................ 10-2014-0097069

(51) Int. Cl.
*H01L 21/00* (2006.01)
*H01L 23/552* (2006.01)
(Continued)

(52) U.S. Cl.
CPC .......... *H01L 23/552* (2013.01); *H01L 21/561* (2013.01); *H01L 23/3128* (2013.01); *H01L 23/49811* (2013.01); *H01L 23/49827* (2013.01); *H01L 24/97* (2013.01); *H01L 25/0657* (2013.01); *H01L 25/50* (2013.01); *H01L 23/49822* (2013.01); *H01L 24/16* (2013.01); *H01L 2224/16227* (2013.01); *H01L 2224/97* (2013.01); *H01L 2225/06517* (2013.01); *H01L 2225/06541* (2013.01);
(Continued)

(58) Field of Classification Search
None
See application file for complete search history.

(56) References Cited

U.S. PATENT DOCUMENTS

| 5,935,405 A | 8/1999 | Wolf et al. |
| 7,342,303 B1 | 3/2008 | Berry et al. |

(Continued)

FOREIGN PATENT DOCUMENTS

| JP | 10-107403 A | 4/1998 |
| KR | 10-2011-0131622 A | 12/2011 |

(Continued)

OTHER PUBLICATIONS

Korean Office Action issued on Aug. 4, 2015 in counterpart Korean Application No. 10-2014-0097069 (12 pages with English translation).

*Primary Examiner* — Evren Seven
(74) *Attorney, Agent, or Firm* — NSIP Law (57) ABSTRACT

The package includes: a substrate having at least one circuit layer; at least one electronic component mounted on at least one surface of the substrate; a molded part formed on the surface of the substrate to enclose the electronic component; at least one via formed in the molded part to be electrically connected to the circuit layer of the substrate; and a pattern connected to one end of a plated tail connected to the circuit layer connected to the via and exposed to the exterior of the substrate.

6 Claims, 4 Drawing Sheets

(51) Int. Cl.
  *H01L 21/56* (2006.01)
  *H01L 25/00* (2006.01)
  *H01L 25/065* (2006.01)
  *H01L 23/498* (2006.01)
  *H01L 23/31* (2006.01)
  *H01L 23/00* (2006.01)

(52) U.S. Cl.
  CPC ............ *H01L 2225/06555* (2013.01); *H01L 2924/15311* (2013.01); *H01L 2924/19105* (2013.01); *H01L 2924/3025* (2013.01)

(56) References Cited

U.S. PATENT DOCUMENTS

| | | | | |
|---|---|---|---|---|
| 7,745,910 B1* | 6/2010 | Olson | ................... | H01L 21/561 257/659 |
| 8,093,690 B2* | 1/2012 | Ko | ................... | H01L 21/561 257/660 |
| 8,199,518 B1* | 6/2012 | Chun | ................... | H01L 23/49811 361/767 |
| 8,212,339 B2* | 7/2012 | Liao | ................... | H01L 21/6835 257/659 |
| 8,378,466 B2* | 2/2013 | Chiu | ................... | H01L 21/568 257/508 |
| 8,410,584 B2* | 4/2013 | An | ................... | H01L 23/3121 257/659 |
| 8,598,690 B2* | 12/2013 | Chandra | ................... | H01L 21/561 174/377 |
| 8,809,694 B2* | 8/2014 | Yoshida | ................... | H01L 23/552 174/260 |
| 8,884,424 B2* | 11/2014 | Su | ................... | H01L 21/4857 257/700 |
| 8,946,886 B1* | 2/2015 | Fuentes | ................... | H01L 23/552 257/678 |
| 8,963,298 B2* | 2/2015 | Yao | ................... | H01L 23/552 257/659 |
| 9,129,954 B2* | 9/2015 | Yen | ................... | H01L 23/498 |
| 9,172,131 B2* | 10/2015 | Chen | ................... | H01Q 1/2283 |
| 9,236,356 B2* | 1/2016 | Yang | ................... | H01L 23/49838 |
| 2004/0125577 A1* | 7/2004 | Vinciarelli | ................... | H01L 23/49833 361/778 |
| 2006/0022333 A1 | 2/2006 | Shivkumar et al. | | |
| 2007/0030661 A1 | 2/2007 | Morris et al. | | |
| 2009/0236700 A1* | 9/2009 | Moriya | ................... | H01L 23/29 257/659 |
| 2010/0207258 A1* | 8/2010 | Eun | ................... | H01L 23/055 257/660 |
| 2011/0006408 A1* | 1/2011 | Liao | ................... | H01L 21/561 257/660 |
| 2011/0013349 A1* | 1/2011 | Morikita | ................... | H05K 1/0218 361/679.02 |
| 2011/0298111 A1* | 12/2011 | Kim | ................... | H01L 21/561 257/660 |
| 2013/0292808 A1* | 11/2013 | Yen | ................... | H01L 23/552 257/660 |

FOREIGN PATENT DOCUMENTS

KR   10-2012-0080320 A   7/2012
KR   10-2014-0041643 A   4/2014

* cited by examiner

PACKAGE AND METHOD OF MANUFACTURING THE SAME

CROSS-REFERENCE TO RELATED APPLICATION

This application claims the priority and benefit of Korean Patent Application No. 10-2014-0097069 filed on Jul. 30, 2014, with the Korean Intellectual Property Office, the disclosure of which is incorporated herein by reference.

BACKGROUND

The present disclosure relates to a package and a method of manufacturing the same.

Recent electronic devices have been required to have a package thickness of 1.15 mmT or less, based on a double-sided substrate, and a subminiature size according to reductions in the thicknesses of mobile phones. Accordingly, the mounting density of modules has increased.

SUMMARY

An aspect of the present disclosure provides a package having a plating mold via interconnect ion structure in which electrodes may be formed, and a method of manufacturing the same.

An aspect of the present disclosure also provides a package having a significantly reduced influence of a plated tail, and a method of manufacturing the same.

An aspect of the present disclosure also provides a package capable of excellently implementing electromagnetic wave interference and electromagnetic wave susceptibility characteristics after performing a dicing process for dividing the substrate into separate packages, and a method of manufacturing the same.

According to an aspect of the present disclosure may include: vias formed in molded parts surrounding electronic components so as to be electrically connected to circuit layers of a substrate; and a pattern connected to one end of a plated tail connected to the circuit layer connected to the via so as to be exposed to the exterior of the substrate.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

A term "package" used in the present disclosure is a concept including wireless communications such as Wi-Fi, and an electronic element module, and is not limited to a bare package.

Package

Figure 1:
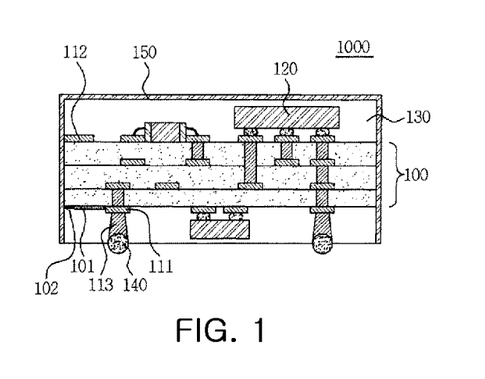
FIG. 1 is a cross-sectional view illustrating a package according to an exemplary embodiment in the present disclosure.

FIG. 1 is a cross-sectional view illustrating a package according to an embodiment in the present disclosure.

Referring to FIG. 1, a package 1000 may include a substrate 100 having a plurality of circuit layers, one or more electronic components 120 mounted on both surfaces of the substrate 100, molded parts 130 formed on both surfaces of the substrate 100 so as to surround the electronic components 120, vias 113 formed in the molded parts 130 so as to be electrically connected to the circuit layers of the substrate 100, and a pattern 102 connected to one end of a plated tail 101 connected to the circuit layer connected to the via 113 and exposed to the exterior of the substrate 100.

The substrate 100 is a circuit substrate having one or more circuit layers formed on an insulating layer, and as the substrate 100, various kinds of substrates such as a substrate, a printed circuit board, and a metal substrate which are well known in the art may be used.

As an example of the insulating layer, a resin insulating layer may be used in a case of the printed circuit board or a ceramic insulating layer may be used in a case of the substrate, for example. As materials of the resin insulating layer, a thermosetting resin such as an epoxy resin, a thermoplastic resin such as polyimide, a resin having a reinforcement material such as a glass fiber or an inorganic filler impregnated in the thermosetting resin and the thermoplastic resin, for example, prepreg may be used. In addition, a photo-curable resin, and the like, may be used. However, the materials of the resin insulating layer are not particularly limited thereto.

As a material of the circuit layer, any material may be used without being limited as long as it is used as a conductive metal for a circuit in a circuit substrate field, and copper is typically used in the printed circuit board.

As the circuit layers, mounting electrodes for mounting the electronic component 120, or circuit patterns that electrically connect the mounting electrodes to each other may be formed. In addition, vias for an electrical connection may be formed between the respective layers of the substrate 100.

According to the present exemplary embodiment, as the circuit layers, via pads 111 may be formed on a lower surface of the substrate 100 and ground electrodes 112, a part of conductive pattern, may be formed on an upper surface of the substrate 100. The via pads 111 and the ground electrodes 112 will be described below together with a related configuration.

The electronic components 120 may be mounted on both surfaces of the substrate 100 by a typical wire bonding or flip-chip bonding. Further, the electronic components 120 may be embedded in the substrate 100.

The electronic components 120 may include various electronic elements such as passive elements and active elements, and any electronic elements may be all used as the electronic components 120 as long as they may be mounted on the substrate 100 or be embedded in the substrate 100.

The molded parts 130 may be formed on both surfaces of the substrate 100 so as to surround the electronic components 120 in order to safely protect the electronic components 120, wires, connection parts, and the like from external impact.

The molded parts 130 may be made of, for example, an insulating material including a resin material such as an epoxy molded compound (EMC) or a silicon based epoxy, or the like, but is not particularly limited thereto.

The vias 113 that penetrate through the molded parts 130 may be formed in the molded parts 130 so as to be in surface-contact with the via pads 111 of the substrate 100 and be electrically connected to the via pads 111. The via 113 may have an external connection terminal for a connection with an external component or a package formed on a lower end thereof, for example, a solder bump 140.

Here, the plated tail 101 formed to be coplanar with the via pad 111 may be connected to the via pad 111. The pattern 102 may be connected to one end of the plated tail 101 and be exposed to the exterior of the substrate 100. That is, a side surface of the pattern 102 may be formed on to be substantially coplanar with a side surface of the substrate 100, so as to be exposed to the side surface of the substrate 100.

The case in which the pattern 102 is formed on one side surface of the lower surface of the substrate 100 is shown in the drawings by way of example, but the present disclosure is not limited thereto. For example, the pattern 102 may be formed at various positions and in various shapes depending on a position of the plated tail 101 connected to the pattern 102. For example, the plated tail 101 and the pattern 102 may be formed on the upper surface of the substrate or an intermediate circuit layer of the substrate.

If necessary, the pattern 102 may or may not have conductivity.

Since the pattern 102 demonstrates conductivity at the time of plating the via 113 in a process of manufacturing the package, the pattern 102 may be connected to the plated tail 101 and may be electro-plated by a current applied through the plated tail 101 connected thereto. On the contrary, the pattern 102 may lose conductivity in a final product by a separate nonconductor treatment after forming the via 113 by the plating process, during a dicing process for dividing the substrate into separate packages, or after the dicing process.

However, the present inventive concept is not limited thereto. If necessary, the pattern 102 may be formed to retain conductivity in the finished product by omitting the nonconductor treatment. Alternatively, portions of the pattern 102 may retain conductivity, but the other portions thereof may lose conductivity. In this case, the portions of the pattern 102 having conductivity may be used for circuit wiring together with the plated tail 101.

For example, in a case in which the pattern 102 illustrated in FIG. 1 retains conductivity, the pattern 102 may be electrically connected to the shielding part 150. Therefore, the pattern 102 and the plated tail 101 connected thereto may serve as ground electrodes, and the via 113 and the solder bump 140 electrically connected to the plated tail may serve as a ground via and a ground terminal, respectively. In this case, the ground electrodes 112 may be omitted.

The pattern 102 may have conductivity at the time of plating of the via 113, for example, using a method of transforming the pattern 102 into an insulator by using thermal oxidation characteristics of a material having conductivity, transforming the pattern 102 into the insulator by using oxidation characteristics by laser irradiation, using characteristics in which the material having conductivity is transformed into the insulator by a mechanical process, or using magnetic characteristics of the material having conductivity, or transforming the pattern 102 into the insulator by using an alignment of a metal core of the material having conductivity, and may be then transformed into an insulator that does not have conductivity. The method of transforming the material having conductivity into the insulator is not limited thereto, and any method may be used as long as it is known in the art.

For example, the pattern 102 may be formed of a conductive resin such as a Cu epoxy paste, and the surface thereof may lose conductivity by oxidizing a conductive material such as Cu.

Therefore, the electrodes may be stably formed by a mold via connection structure formed by the electroplating process. Further, since the pattern having conductivity which is connected to the plated tail is transformed into the nonconductor that does not have conductivity by the dicing process for dividing the substrate into the separate packages or by the subsequent separate nonconductor treatment, an influence of the plated tail left within the package may be significantly reduced.

The circuit layer of the substrate 100 may further include a ground electrode 112 formed to be exposed to the exterior of the substrate 100.

The ground electrode 112 may be formed as a metal wiring pattern on the upper surface of the substrate 100. The ground electrode 112 may be formed to be long along the side surface of the substrate 100 on the upper surface of the substrate 100 which is formed in a quadrangular shape. The ground electrode 112 may be formed along at least one side surface of four side surfaces of the substrate 100. A side surface of the ground electrode 112 may be formed to be coplanar with the side surface of the substrate 100, so as to be exposed to the side surface of the substrate 100.

In FIG. 1, the case in which the ground electrode 112 is formed along the side surface of the substrate 100 on the upper surface of the substrate 100 is described by way of example, but the present disclosure is not limited thereto. For example, the ground electrode 112 may be formed on the lower surface of the substrate 100 or an intermediate circuit layer of the substrate 100. In addition, when the ground electrode 112 needs to be electrically connected to a terminal of the electronic component 120, the ground electrode 112 is formed so that a portion thereof is protruded to a lower portion of the electronic component 120, whereby the protruded portion may be electrically connected to the terminal of the electronic component 120.

Further, a shielding part 150 may be formed on outer surfaces of the molded part 130 and the substrate 100 so as to cover an upper surface and side surfaces of the package 1000.

The shielding part 150 may be electrically connected to the exposed portion of the ground electrode 112.

The shielding part 150 may accommodate the electronic component 120 and may be formed on the outer surface of the molded part 130, so as to shield an unnecessary electromagnetic wave introduced from the outside of the substrate 100. In addition, the shielding part 15 may prevent an electromagnetic wave generated by the electronic component 120 from being radiated to the outside. The shielding part 150 may be formed so as to be closely adhered to the molded part and cover the outer surface of the molded part 130.

The shielding part 150 needs to be necessarily grounded in order to shield the electromagnetic wave. To this end, the package 1000 may be configured so that the shielding part 150 is electrically connected to the ground electrode 112. More particularly, the shielding part 150 may be electrically connected to the ground electrode 112 exposed to the exterior of the substrate 100.

The shielding part 150 may be formed of various materials having conductivity and may be formed in a metal case shape, but is not limited thereto. That is, the shielding part 150 may be completed by being formed of a resin material containing conductive powders or directly forming a metal thin film. In the case of forming the metal thin film, various technologies such as a sputtering method, a vapor deposition method, an electroplating method, an electroless plating method, and the like, may be used.

In addition, the shielding part 150 may be a metal thin film formed by a spray coating method. The spray coating method has advantages in which it may form a uniform application layer and has low investment costs in equipments as compared to other processes. In addition, the shielding part 150 may be a metal thin film formed by a screen printing method.

The package 1000 having the configuration as described above may protect the electronic component 120 mounted on the substrate 100 by the molded parts 130 from external force and further improve an effect of shielding the electromagnetic wave by the shielding part 150 formed on the outer surface of the molded part 130.

In addition, by using the ground electrode 112 formed on the upper surface of the substrate 100 in order to ground the shielding part 150 for shielding the electromagnetic wave, the shielding part 150 may be easily grounded.

Meanwhile, in the package 1000 according to an exemplary embodiment in the present disclosure, after a plurality of packages are simultaneously formed on the substrate having a strip shape, the plurality of packages may be formed in separate packages by a dicing process. A detailed description thereof will be provided in a description of a method of manufacturing a package to be described below.

The package 1000 may also be mounted on a main board of a mobile phone.

Figure 2:
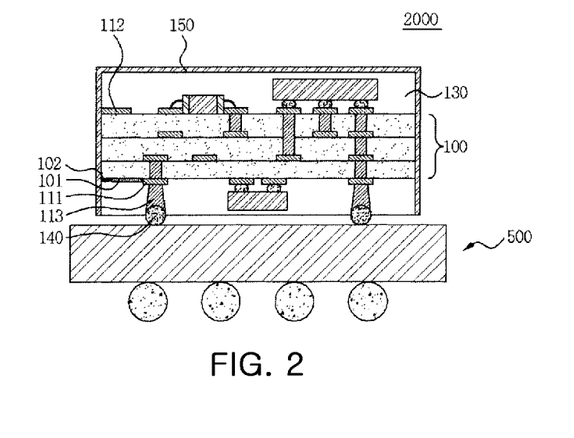
FIG. 2 is a cross-sectional view illustrating a package according to another exemplary embodiment in the present disclosure.

FIG. 2 is a cross-sectional view illustrating a package according to another exemplary embodiment in the present disclosure. Hereinafter, a description of overlapped configurations will be omitted.

Referring to FIG. 2, a package 2000 may include a substrate 100 having a plurality of circuit layers, one or more electronic components 120 mounted on both surfaces of the substrate 100, molded parts 130 formed on both surfaces of the substrate 100 so as to surround the electronic components 120, vias 113 formed in the molded parts 130 so as to be electrically connected to the circuit layers of the substrate 100, a pattern 102 connected to one end of a plated tail 101 connected to the circuit layer connected to the via 113 and exposed to the exterior of the substrate 100, solder bumps 140 formed in the vias 113, and a lower package 500 connected to the solder bumps 140 so as to be mounted thereon.

The lower package 500 is not particularly limited and is a typical package on which components are mounted. The package may have a typical package on package (POP) structure in which the lower package 500 is connected to an upper package through external connection terminals, for example, the solder bumps 140.

The package 2000 may also be mounted on a main board of a mobile phone.

Method of Manufacturing Package

FIGS. 3 through 9 are process cross-sectional views illustrating a method of manufacturing a package according to an exemplary embodiment in the present disclosure in a process sequence.

Figure 3:
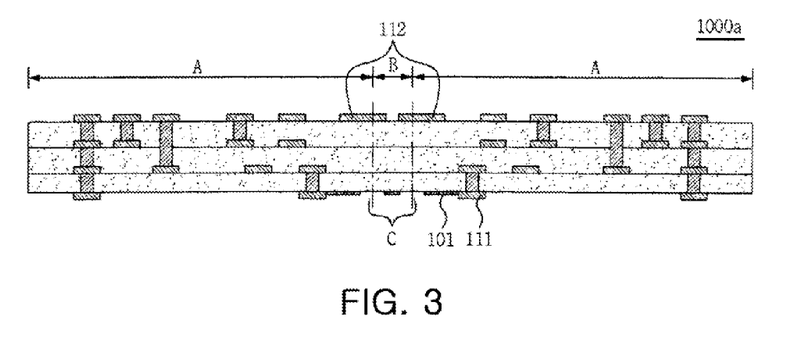
FIGS. 3 through 9 are process cross-sectional views illustrating a method of manufacturing a package according to an exemplary embodiment in the present disclosure in a process sequence.

First, referring to FIG. 3, a strip substrate 1000a having a plurality of separate package regions A which are partitioned by a dicing region B and having via pads 111 connected to one end of plated tails 101 which are separated so as to be disconnected at the dicing region B may be prepared.

The strip substrate 1000a is to simultaneously manufacture a plurality of separate packages and has a plurality of separate package regions A partitioned thereon, and the packages may be manufactured for each of the plurality of separate package regions A.

The substrate 1000a may be a multilayer circuit substrate having a plurality of circuit layers, wherein each circuit layer may include circuit patterns that electrically connect mounting electrodes to each other, external connection terminals, the mounting electrodes, vias, and the like.

According to the present exemplary embodiment, the substrate 1000a may have the via pads 111 formed thereon. The via pad 111 may be connected to one end of the plated tail 101. The plated tail 101 may have disconnected portions C which are separated so as to be disconnected in the dicing region B. The plated tail 101 may be formed to be coplanar with the via pad 111.

Meanwhile, the substrate 1000a may have at least one circuit pattern extended from the separate package region A to the dicing region B. According to the present exemplary embodiment, the circuit patterns extended to the dicing region B may be ground electrodes 112.

When the strip substrate 1000a is diced for each of the separate package regions A, the ground electrodes 112 may be formed along side surfaces of the diced separate substrates.

Selectively, when the strip substrate 1000a is diced for each of the separate package regions A, the ground electrodes 112 may be formed along an overall edge of the diced separate substrates.

Since the via pads 111 and the ground electrodes 112 as described above may be formed by the same method as a method of forming a general circuit pattern, a detailed description thereof will be omitted.

Figure 4:
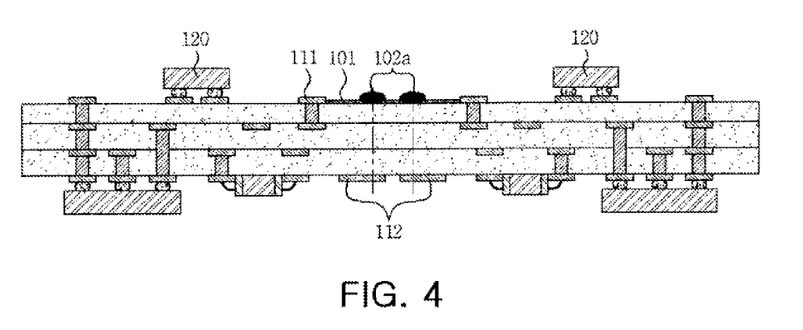

Next, referring to FIG. 4, at least one electronic component 120 is mounted on both surfaces of each of the separate package regions A and patterns 102a having conductivity are formed on the disconnected portions C of the plated tail 101, thereby electrically connecting the separated plated tails 101.

The same kind of electronic component 120 and the same number of electronic components 120 may be disposed and mounted on each of the separate package regions A.

In the present operation, since the pattern 102a has conductivity, a current may be applied through the plated tails 101 which are connected to each other in a plating operation to be described below.

The pattern 102a having conductivity may be formed to be coplanar with the via pad 111.

Figure 5:
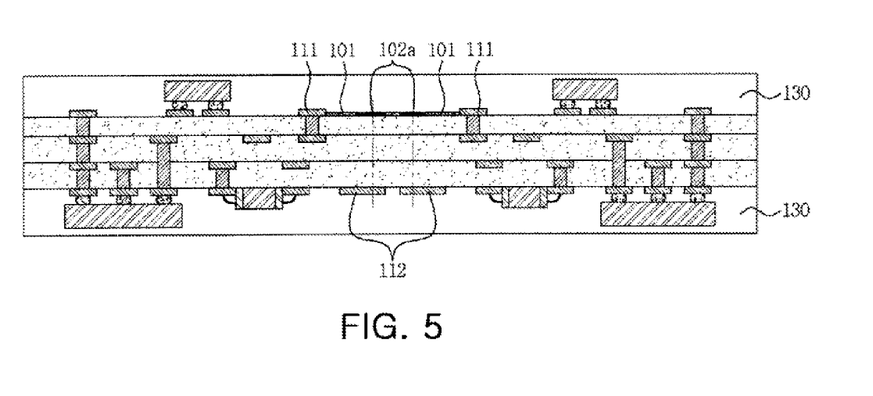

Next, referring to FIG. 5, the molded parts 130 may be formed on both surfaces of the substrate so as to surround the electronic components 120.

The molded parts 130 may be formed by injecting, for example, an insulating material including a resin material such as an epoxy molded compound (EMC) or a silicon based epoxy, or the like, into the substrate, but is not particularly limited thereto.

Figure 6:
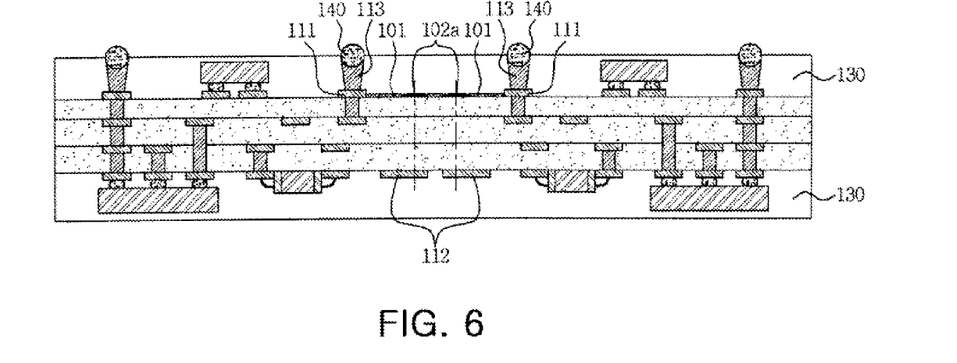

Next, referring to FIG. 6, the current may be applied through the plated tail 101 connected by the pattern 102a having conductivity, thereby forming the vias 113 penetrating through the molded part 130 on the via pads 111. The vias 113 may be extended from the via pads 111 to a lower surface of the molded part 130. As result, since a lower surface thereof is formed to be substantially coplanar with the lower surface of the molded part 130, the vias 113 may be exposed to the lower surface of the molded part 130.

Specifically, via holes penetrating through the molded part 130 so as to expose the via pads 111 are first formed and the current is then applied through the plated tail 101 connected to the via pads 111, such that the vias 113 may be formed by filling the via holes with an electroplating layer.

In this case, the solder bumps 140 as the external connection terminals may be selectively formed on the exposed portions of the vias 113.

However, the present disclosure is not limited thereto, but the solder bumps 140 may also be mounted on each of the separate packages after the dicing process in which the substrate is diced into the separate packages, if necessary.

Figure 7:
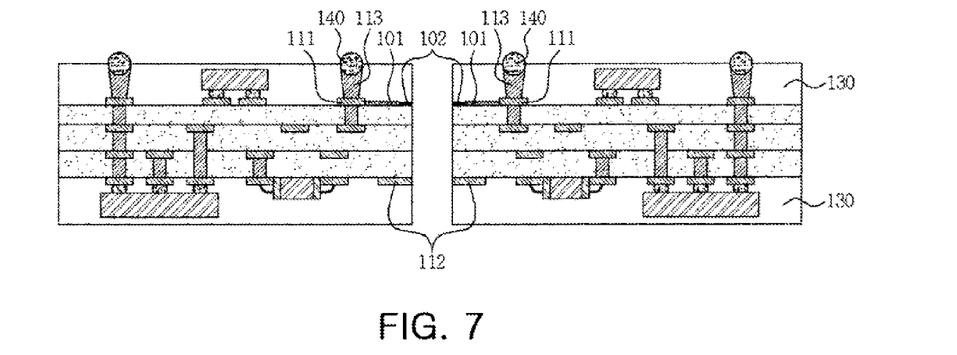

Next, referring to FIG. 7, the substrate may be divided into the separate packages having the pattern 102 exposed externally by dicing the substrate in the dicing region B.

The dicing process of the substrate in the dicing region B may be performed by a router, a blade, laser, or a combination thereof.

Here, the pattern 102a having conductivity may be transformed into a nonconductor that does not have conductivity by heat, laser, or the like generated in the dicing process of the substrate in the dicing region B, and consequently, may become a pattern 102 that does not have conductivity.

As described above, since the pattern demonstrates conductivity at the time of plating the via 113, the pattern may be connected to the plated tail 101 and the electroplating process may be performed by the current applied through the plated tail 101 connected to the pattern. On the contrary, after the vias 113 are formed by the plating process, the pattern having conductivity may lose conductivity by the dicing process for dividing the substrate into the separate packages.

Selectively, a nonconductor treatment is separately performed for the exposed portions of the pattern having conductivity after the dicing process, such that the pattern may also lose conductivity in the finished product.

In addition, the pattern having conductivity may lose conductivity by heat, laser, or the like generated in the dicing process and a separate nonconductor treatment may also be additionally performed for the exposed portions of the pattern at the same time, if necessary.

The pattern may have conductivity at the time of plating of the via 113, for example, using a method of transforming the pattern into an insulator by using thermal oxidation characteristics of a material having conductivity, transforming the pattern into the insulator by using oxidation characteristics by laser irradiation, using characteristics in which the material having conductivity is transformed into the insulator by a mechanical process, or using magnetic characteristics of the material having conductivity, or transforming the pattern into the insulator by using an alignment of a metal core of the material having conductivity, and may be then transformed into an insulator that does not have conductivity. The method of transforming the material having conductivity into the insulator is not limited thereto, and any method may be used as long as it is known in the art.

Therefore, the electrodes may be stably formed by the mold via connection structure formed by the electroplating process. Further, since the pattern having conductivity which is connected to the plated tail is transformed into the nonconductor that does not have conductivity by the dicing process for dividing the substrate into the separate packages and/or by the subsequent separate nonconductor treatment, an influence of the plated tail left within the package may be significantly reduced.

Meanwhile, the ground electrode 112 may also be diced by the dicing process to be exposed to the exterior of the separate package.

Figure 8:
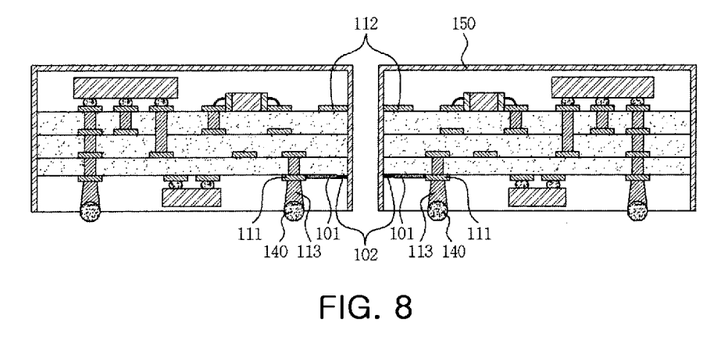

Next, referring to FIG. 8, the shielding part 150 may be formed so as to cover at least portion of outer surfaces of the separate packages which are diced and divided as described above. Here, the shielding part 150 may be electrically connected to the exposed portion of the ground electrode 112.

In order to implement an electromagnetic wave shield and ground preventing power of an electromagnetic wave from being transitioned into an inner portion/outer portion of the package, the shielding part 150 may be configured by forming a thin and uniform coating film made of a material of shielding the electromagnetic wave on outer walls of the molded parts 130.

The shielding part 150 may be formed by a typical plating method, an ion plating method, a spray coating method, a vacuum deposition method, or the like, but is not particularly limited thereto.

Examples of a conductive filler contained in the shielding part 150 may include a metallic based material (e.g., Ag, Cu, Ni), a metallic complex material, a carbon based material, a conductive polymer based material, or the like.

By forming the shielding part 150 as described above, noise due to radio wave inter-disturbance between transmitting and receiving apparatuses may be shielded, an efficiency deterioration and life reduction of internal components may be prevented, and harm against a body due to the electromagnetic wave which is self generated may be prevented.

Figure 9:
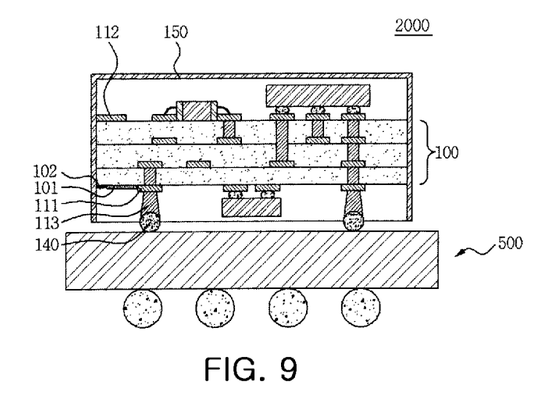

Next, referring to FIG. 9, the lower package 500 may be mounted on the solder bumps 140.

The lower package 500 is not particularly limited and is a typical package on which components are mounted. The package may have a typical package on package (POP) structure in which the lower package 500 is connected to an upper package through external connection terminals, for example, the solder bumps 140.

However, since the process of forming the package in the POP structure including the lower package 500 is a process which is additionally performed, if necessary, it may be omitted.

Therefore, the package in which the shielding part shown in FIG. 8 is formed may be directly mounted on the main board of the mobile phone, or the package of the POP structure including the lower package may also be mounted on the main board, if necessary.

While exemplary embodiments have been shown and described above, it will be apparent to those skilled in the art that modifications and variations could be made without departing from the scope of the present invention as defined by the appended claims.

What is claimed is:

1. A package comprising:
   a substrate having a wiring pattern deposited on a first surface thereof, the wiring pattern having a plated tail;
   an electronic component mounted on the wiring pattern;
   a molded part provided on the first surface of the substrate to enclose the electronic component;

a via provided in the molded part to be connected to the plated tail;

a shielding part encasing the substrate, the electronic component, and the molded part, leaving a second surface of the substrate exposed; and a nonconductive pattern coplanar with the wiring pattern and plated tail, the nonconductive pattern extending between and in physical contact with both the plated tail and the shielding part.

2. The package of claim 1, wherein the wiring pattern connected to the via is provided with a via pad in surface-contact with the via.

3. The package of claim 1, wherein the wiring pattern has a circuit pattern which is exposed to the exterior of the substrate.

4. The package of claim 3, wherein the circuit pattern is a ground electrode.

5. The package of claim 4, wherein the ground electrode is provided on an edge of the substrate.

6. A package comprising:

a substrate having a wiring pattern deposited on a first surface thereof, the wiring pattern having a plated tail;

an electronic component mounted on the wiring pattern;

a molded part provided on the first surface of the substrate to enclose the electronic component;

a via provided in the molded part to be connected to the plated tail;

a shielding part encasing the substrate, the electronic component, and the molded part, leaving a second surface of the substrate exposed;

a nonconductive pattern coplanar with the wiring pattern and the plated tail, the nonconductive pattern extending between and in physical contact with both the plated tail and the shielding part;

a solder bump provided on the via where the via is exposed from the second surface of the substrate; and a lower package mounted on the solder bump.

\* \* \* \* \*